US011359797B1

(12) United States Patent
Chen et al.

(10) Patent No.: US 11,359,797 B1
(45) Date of Patent: Jun. 14, 2022

(54) CHIP-ON-BOARD LED LIGHTING DEVICES

(71) Applicant: Advanced Lighting Concepts, LLC, San Diego, CA (US)

(72) Inventors: Liang Chen, Shenzhen (CN); Alicia Cheng, San Diego, CA (US)

(*) Notice: Subject to any disclaimer, the term of this patent is extended or adjusted under 35 U.S.C. 154(b) by 0 days.

(21) Appl. No.: 17/100,608

(22) Filed: Nov. 20, 2020

(51) Int. Cl.
| F21V 19/00 | (2006.01) |
| F21S 4/22 | (2016.01) |
| H05K 1/18 | (2006.01) |
| F21V 9/32 | (2018.01) |
| H05B 45/46 | (2020.01) |
| F21V 23/00 | (2015.01) |
| F21Y 115/10 | (2016.01) |
| F21Y 103/10 | (2016.01) |
| H05B 45/345 | (2020.01) |

(52) U.S. Cl.
CPC ............ *F21V 19/0025* (2013.01); *F21S 4/22* (2016.01); *F21V 9/32* (2018.02); *F21V 23/005* (2013.01); *H05B 45/46* (2020.01); *H05K 1/189* (2013.01); *F21Y 2103/10* (2016.08); *F21Y 2115/10* (2016.08); *H05B 45/345* (2020.01); *H05K 2201/10106* (2013.01)

(58) Field of Classification Search
CPC .......... F21V 19/0025; F21V 9/32; F21V 9/35; F21V 23/005; F21S 4/22; F21S 4/24; F21S 4/26; H05K 1/189; H05K 2201/10106; H05B 45/46; H05B 45/52; H05B 45/54; H05B 45/345; F21Y 2103/10
See application file for complete search history.

(56) References Cited

U.S. PATENT DOCUMENTS

| 5,196,819 | A | * | 3/1993 | Roberts | ................ | H01H 85/046 |
| | | | | | | 29/623 |
| 7,064,498 | B2 | | 6/2006 | Dowling et al. | | |
| 7,140,751 | B2 | | 11/2006 | Lin | | |
| 7,659,674 | B2 | | 2/2010 | Mueller et al. | | |
| 8,080,819 | B2 | | 12/2011 | Mueller et al. | | |
| 8,207,821 | B2 | | 6/2012 | Roberge et al. | | |

(Continued)

FOREIGN PATENT DOCUMENTS

| AT | 500792 | 3/2006 |
| EP | 1428415 | 6/2004 |

(Continued)

OTHER PUBLICATIONS

International Search Report and Written Opinion received in corresponding international application No. PCT/US21/60261, dated Mar. 15, 2022, 10 pages.

*Primary Examiner* — Alan B Cariaso
(74) *Attorney, Agent, or Firm* — Verrill Dana, LLP; Robert L. Hover

(57) ABSTRACT

COB LED lighting devices are provided having a substrate, at least one parallel-connected LED segment formed on the substrate, at least one series-connected LED groups mounted to the substrate, each of the LED groups also including at least one parallel-connected LEDs, each LED connected to a pad of the substrate, the device also including a phosphor binder distributed over the LED segments on the substrate, and a current control circuit in electrical communication with each of the LED segments, each current control circuit formed on the substrate adjacent to the LED segments, external to the phosphor binder.

27 Claims, 20 Drawing Sheets

(56) References Cited

U.S. PATENT DOCUMENTS

| | | | |
|---|---|---|---|
| 8,556,463 | B2 | 10/2013 | Wang et al. |
| 8,573,823 | B2 | 11/2013 | Dau et al. |
| 9,555,610 | B2 | 1/2017 | Carroll et al. |
| 9,900,954 | B2 | 2/2018 | Engelen et al. |
| 10,386,023 | B2 | 8/2019 | Myers et al. |
| 10,476,543 | B2 | 11/2019 | Cramer |
| 10,856,589 | B1* | 12/2020 | Lee ................. A41D 27/20 |
| 2005/0174473 | A1 | 8/2005 | Morgan et al. |
| 2006/0002110 | A1 | 1/2006 | Dowling et al. |
| 2009/0294780 | A1* | 12/2009 | Chou ................. F21K 9/20 257/88 |
| 2009/0296382 | A1* | 12/2009 | Maier ............... H01L 33/54 362/218 |
| 2011/0254023 | A1 | 10/2011 | Shibusawa |
| 2012/0134155 | A1* | 5/2012 | Wendt ............... H05B 47/10 362/249.03 |
| 2012/0326634 | A1* | 12/2012 | Li ................... H05B 45/46 315/312 |
| 2014/0077236 | A1* | 3/2014 | Yamada ............. H01L 33/56 257/88 |
| 2016/0143100 | A1* | 5/2016 | Miyoshi ........... G03B 21/2053 315/120 |
| 2016/0242251 | A1 | 8/2016 | Newton et al. |
| 2017/0045666 | A1 | 2/2017 | Vasylyev |
| 2017/0154920 | A1* | 6/2017 | Ono ................... H01L 33/62 |
| 2017/0202061 | A1 | 7/2017 | Allen |
| 2017/0205057 | A1 | 7/2017 | Winkler et al. |
| 2017/0339756 | A1* | 11/2017 | Ahn ................... H05B 45/38 |
| 2017/0359869 | A1* | 12/2017 | Ohta .................. H05B 45/50 |
| 2018/0376566 | A1* | 12/2018 | Newton ............. H05B 47/18 |
| 2019/0234568 | A1 | 8/2019 | Doll |
| 2020/0049324 | A1 | 2/2020 | Vasylyev |
| 2021/0100083 | A1* | 4/2021 | McRae ............... H05B 45/46 |

FOREIGN PATENT DOCUMENTS

| | | |
|---|---|---|
| EP | 1583147 | 10/2005 |
| JP | 2002076574 A | 3/2002 |
| JP | 2019184741 | 10/2019 |
| WO | WO2005012997 | 2/2005 |
| WO | 2013/018176 A1 | 2/2013 |
| WO | WO2016071845 | 5/2016 |
| WO | WO 2016/096615 | 7/2017 |
| WO | WO2018069453 | 4/2018 |

\* cited by examiner

CHIP-ON-BOARD LED LIGHTING DEVICES

FIELD OF THE INVENTION

This invention relates to a chip-on-board strip light and more particularly to a chip-on-board LED strip light having external resistors.

BACKGROUND OF THE INVENTION

Light emitting diodes ("LED"s) have widely replaced conventional lighting technologies such as incandescent, fluorescent, halogen, and metal-halide bulbs or fixtures. This adoption of LEDs was initially driven primarily by the much higher efficiency, lifespan, and durability of LEDs compared to such conventional lighting technologies. However, more recently, the small size, color-tunability, and ease of integration into computer-controlled electronic circuits has permitted the lighting industry to move away from the conventional "light bulb" construct and drive more creative lighting design.

LED strip lights (also referred to as "LED tape") are one form of lighting that has been enabled by the advantageous features of LEDs. In general, LED strip lights include a large number of LEDs mounted linearly along a narrow, flexible substrate or circuit board (e.g., a printed circuit board ("PCB")) such that the strip light resembles adhesive tape. The LEDs are typically grouped into a plurality of parallel-connected segments or branches of a fixed length, each segment or branch having a desired number of LEDs and at least one current-limiting resistor mounted in close proximity to one another in some linear order along the strip (e.g., a segment could have three LEDs and one resistor and be mounted in an LED, LED, resistor, LED pattern). Those parallel-connected segments are then "daisy-chained" together with cut lines formed between each segment such that the overall LED strip can be trimmed to a desired length.

However, because LED strip lights are nothing more than a naked circuit board with exposed LEDs, such strip lights can lack aesthetic appeal, produce uneven, harsh illumination, and cannot control the illumination direction, potentially wasting the light energy (typically measured in lumens) produced by the constituent LED chips and reducing the light intensity of the strip within the space to be illuminated.

BRIEF SUMMARY OF THE INVENTION

Provided herein are systems and methods for chip-on-board ("COB") LED lighting devices.

In one aspect, a COB LED lighting device is provided. The device includes a substrate. The device also includes at least one parallel-connected LED segment formed on the substrate. Each LED segment includes at least one series-connected LED groups mounted to the substrate. Each of the LED groups also includes at least one parallel-connected LEDs, each LED connected to a pad of the substrate. The device also includes a phosphor binder distributed over the LED segments on the substrate. The device also includes a current control circuit in electrical communication with each of the LED segments, each current control circuit formed on the substrate adjacent to the LED segments, external to the phosphor binder.

In some embodiments, the substrate is flexible. In some embodiments, the substrate is a printed circuit board (PCB). In some embodiments, the PCB includes an integrated buffer configured to provide shock absorbing properties to the PCB proximate the LEDs. In some embodiments, the integrated buffer is an air sac formed in the PCB. In some embodiments, each LED group includes at least two parallel-connected LEDs. In some embodiments, each LED segment includes at least two series-connected LED groups. In some embodiments, the current control circuit includes a current limiting resistor group in electrical communication with each of the LED segments and including at least one current limiting parallel-connected resistors. In some embodiments, the current control circuit includes an integrated chip (IC) constant current circuit. In some embodiments, the current control circuit includes an external transistor and MOS transistor constant current circuit.

In some embodiments, the COB LED lighting device is a strip light. In some embodiments, the LED segments are formed on the substrate at a density of at least 120 LEDs per meter. In some embodiments, the COB LED lighting device is a light panel. In some embodiments, the LED segments are formed on the substrate at a density of at least 1200 LEDs per square meter. In some embodiments, a cross-section of the phosphor binder is shaped to produce a beam angle of 180° or less in an illuminated state of the LED segments. In some embodiments, the cross-section of the phosphor binder is shaped to produce the beam angle between 170° and 120° in an illuminated state of the LED segments. In some embodiments, the cross-section of the phosphor binder is at least one of semi-circular, semi-elliptical, semi-hexagonal, semi-octagonal, semi-decagonal, semi-dodecagonal, square, rectangular, trapezoidal, irregular shapes, or any other combination of straight and curved elements. In some embodiments, the phosphor binder includes a first side and a second side, the first side including a first ridge formed thereon and the second side including a second ridge formed thereon. In some embodiments, the first ridge and the second ridge are sized and positioned to achieve a desired beam angle. In some embodiments, the LEDs are oriented to emit light substantially perpendicular to the substrate. In some embodiments, the LEDs are oriented to emit light substantially parallel to the substrate. In some embodiments, each LED segment further comprises a pair of input electrical contacts formed on the substrate at an input end of the LED segment and pair of output electrical contacts formed on the substrate at an output end of the LED segment, each of the input and output electrical contacts formed on the substrate adjacent to the LED segments, external to the phosphor binder.

In some embodiments, the input electrical contacts are electrically connectable to at least one of a DC power source or a pair of output contacts of a different LED segment. In some embodiments, the output electrical contacts are electrically connectable to a pair of input contacts of a different LED segment or are positioned at a terminal end of the COB LED lighting device. In some embodiments, the substrate further comprises a first side and a second side. In some embodiments, the LED segments, the phosphor binder, the current limiting resistor groups, and the input and output contacts are all formed on the first side of the substrate. In some embodiments, the substrate further comprises a first side and a second side. In some embodiments, the LED segments, the phosphor binder, and the current limiting resistor groups are all formed on a same one of the first side or the second side of the substrate. In some embodiments, the device also includes an adhesive distributed over the second side of the substrate. In some embodiments, the LEDs are configured to emit light in at least one of a single, homogenous white, a single, homogenous non-white color, a combination of non-white colors, or a combination of white with one or more non-white colors.

These and other features of the invention will be apparent from the following detailed description and the accompanying figures, in which:

DETAILED DESCRIPTION OF INVENTION

Figure 1A:
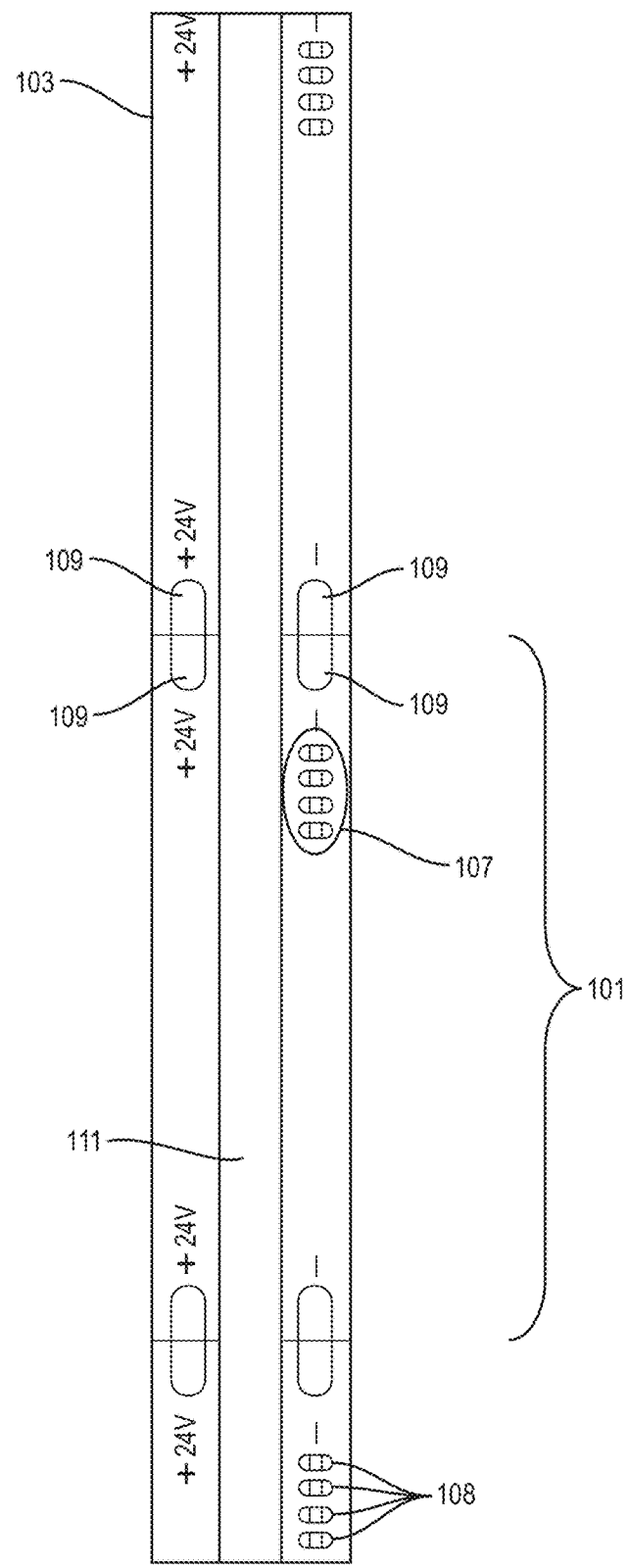
FIG. 1A is a top plan view of a COB LED lighting device in accordance with various embodiments.

The disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure. Moreover, it is noted that like reference numerals represent similar parts throughout the several views of the drawings.

Provided herein are COB LED lighting devices, particularly, chip-on-board ("COB") LED strip lights having external resistors. Although not restricted to any particular LED lighting application, one suitable application that the invention may be used in is LED strip (or "tape") lighting. Such COB LED lighting devices will be described to provide context for COB LED lighting devices but is not limited to that configuration and can also include, for example, LED panel lighting.

Figure 1B:
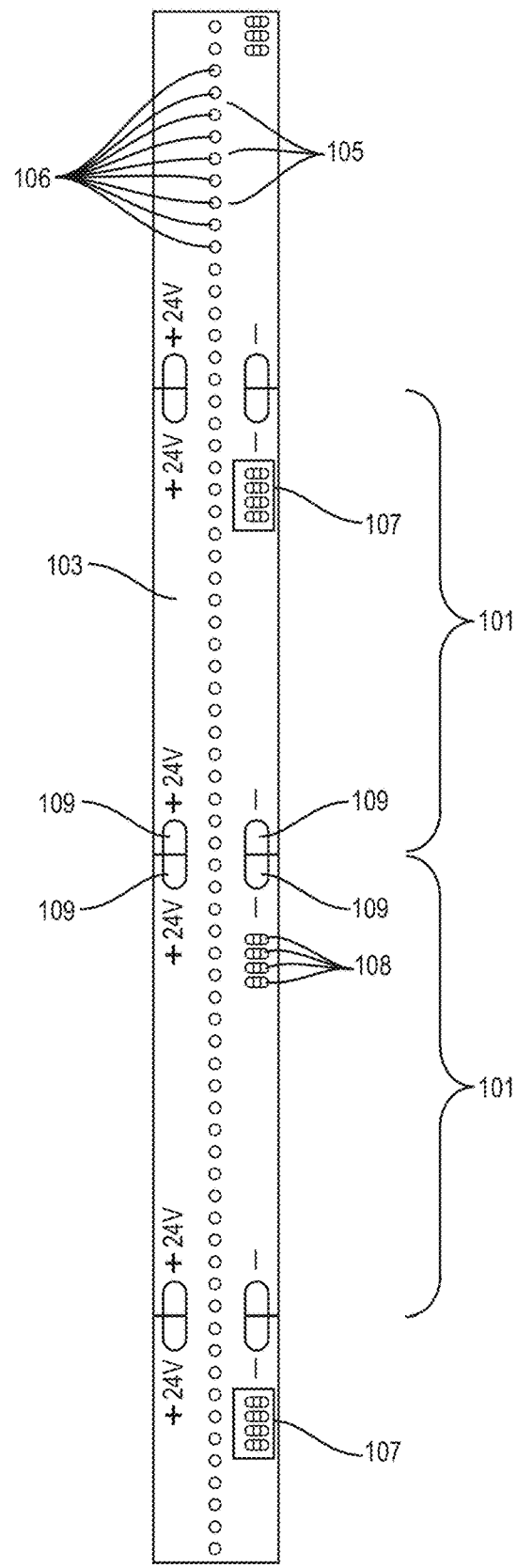
FIG. 1B is a top plan view of the COB LED lighting device of FIG. 1A shown with a phosphor lightguide removed for clarity.
Figure 1C:
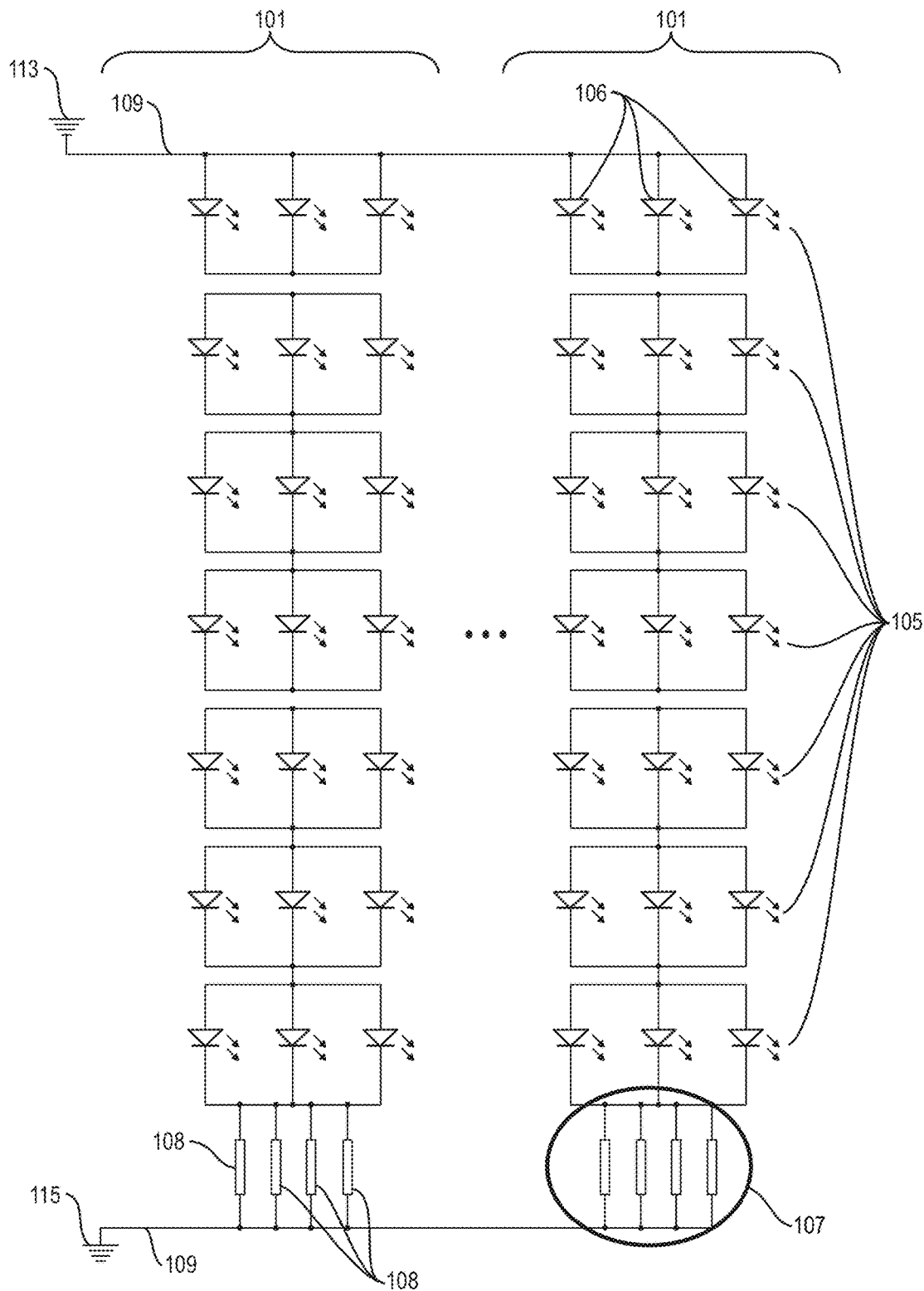
FIG. 1C is a circuit diagram illustrating the schematic layout of a plurality of parallel-connected LED segments of the COB LED lighting device shown in FIGS. 1A and 1B.

Referring to FIGS. 1A-1C, a COB LED lighting device 100 can generally include one or more LED segments 101 formed on a substrate 103 and connectable via electrical contacts 109 to at least one of a power source 113, a ground 115, or additional LED segments 101. The substrate 103 can generally include a first side and a second side. Generally, the LED segments 101 can be formed or mounted on a single first side of the substrate 103, although it will be apparent in view of this disclosure that the LED segments 101 can be formed on both sides of the substrate 103 in accordance with various embodiments. In some embodiments, an adhesive can be distributed over the second side to facilitate attachment of the lighting device 100 to a surface.

Figure 6:
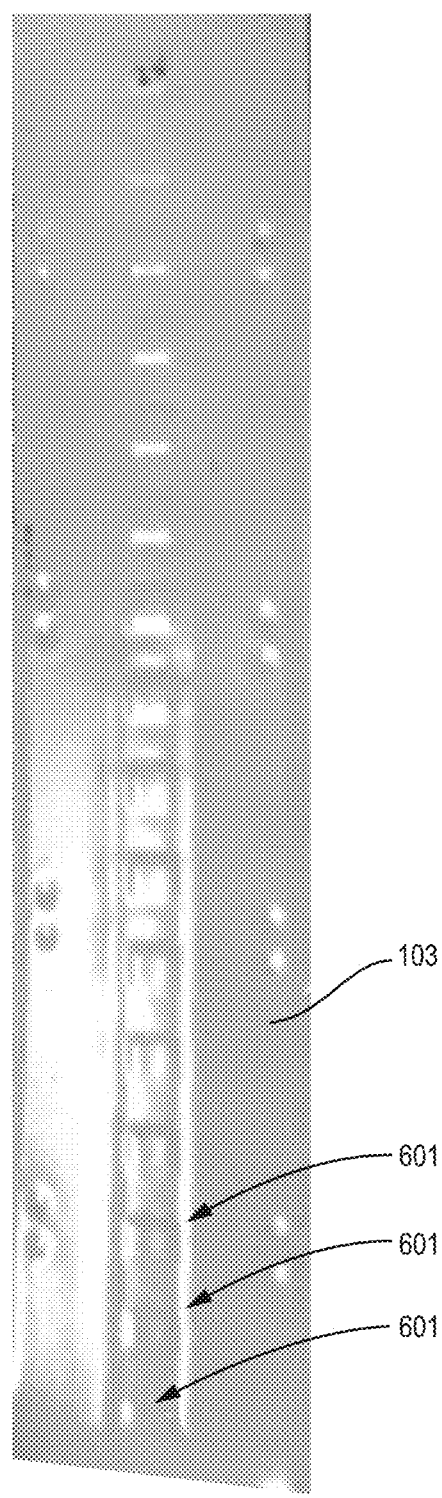
FIG. 6 is a back view of a substrate having integrated buffers in accordance with various embodiments

The substrate 103 can be any suitable substrate on which to form the LED segments 101 including, for example, a printed circuit board (PCB). In some embodiments, to protect the LEDs 106 mounted on the substrate 103, the substrate can include one or more integrated buffers 601 as shown in FIG. 6 on the second side to act as a shock absorber for protecting the fragile LED chips 106. For example, as shown in FIG. 6, the buffers can include a plurality of air pockets positioned behind each of the LEDs 106.

As shown in FIGS. 1A-1C and 5A-5C, in some embodiments, the substrate 103 can be flexible for constructing LED lighting devices 100 in the form of LED strip/tape lights or flexible light panels. However, it will be apparent in view of this disclosure that the lighting devices described herein can also be used in connection with more rigid substrates in accordance with various embodiments. In some embodiments the substrate can generally be constructed from, for example but not limited to, polyester (PET), polyimide (Pi), polyethylene naphthalate (PEN), polyetherimide (PEI), fluoropolymers (FEP) and copolymers, polyimide-fluoropolymers, FR-1, FR-2, FR-3, FR-4, FR-5, FR-6, aluminum, polytetrafluoroethylene (PTFE), ceramic filled PTFE, G-10, G-11, CEM-1, CEM-2, CEM-3, CEM-4, CEM-5, FR-35, alumina, or combinations thereof.

Figure 4:
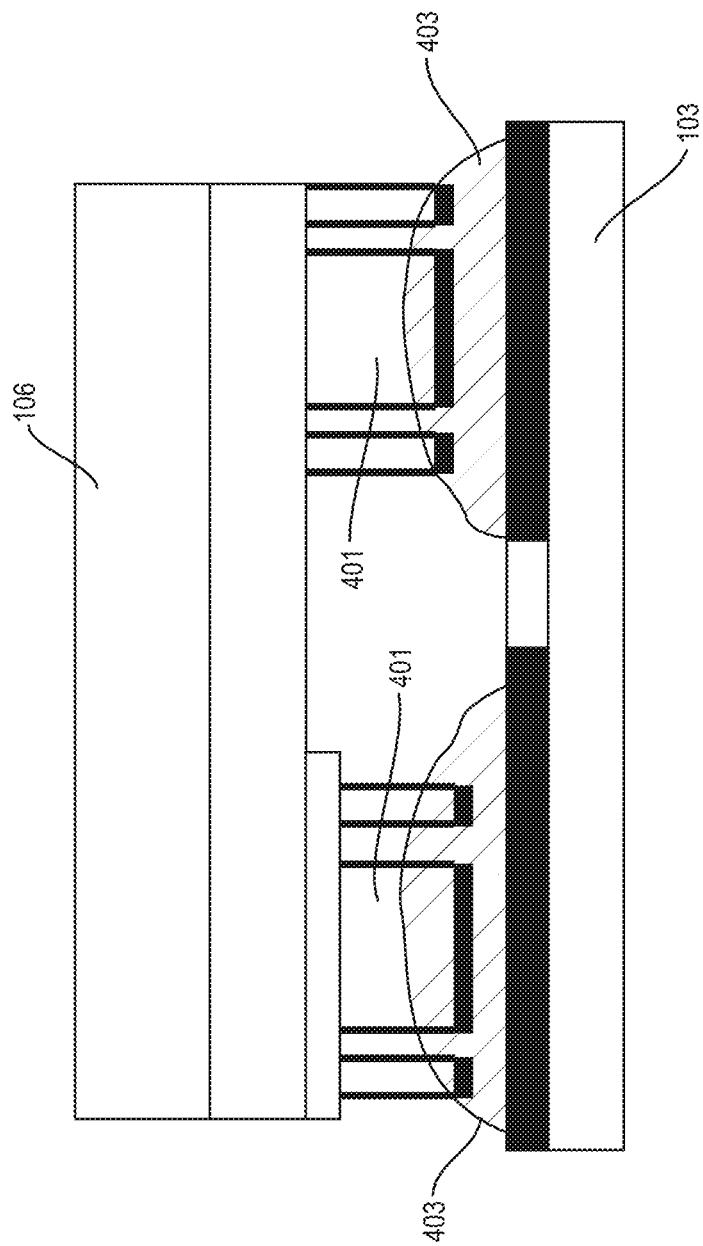
FIG. 4 is a cross-sectional view of an LED mounted to a substrate in accordance with various embodiments.

The LED segments 101 can include at least one series-connected LED groups 105, each having one or more parallel-connected LEDs 106. However, the LED groups 105 can each generally include a plurality of parallel-connected LEDs 106 mounted to the substrate 103. Any suitable chip on board (COB) LEDs can be used in connection with various embodiments in order to produce a desired brightness and color. The LEDs can also be formed on or mounted to the substrate 103 in any suitable manner. For example, as shown in FIG. 4, in some embodiments the LEDs 106 can generally be mounted to the substrate 103 by soldering of one or more contacts 401 (or "LED chip pins") to a pad 403 (e.g., a PCB pad) of the substrate 103 (e.g., a PCB). Advantageously, the configurations of the lighting devices described herein permit direct installation of individual LED chips onto the substrate, thereby reducing the size and form factor of the lighting device, reducing production costs, and producing more even, uniform lighting compared to conventional systems that require multi-chip LED packages.

Referring now to FIG. 1C, in some embodiments, each segment 101 can include seven LED groups 105 and each LED group 105 can include three parallel-connected LEDs 106. However, it will be apparent in view of this disclosure that LED groups 105 can include any number of constituent parallel-connected LEDs 106 and the LED segments 101 can include any number of series-connected LED groups 105 in accordance with various embodiments. Regardless of the number of LEDs 106 included in each group 105, such arrangement can provide redundancy such that, if one or more LEDs 106 fail (e.g., due to overload or age/wear) in a single group, the remaining LEDs 106 (or even just one remaining LED 106) can emit light proximate to that location. Thus, even if some of the LEDs 106 in a group 105 fail, the remaining LED(s) 106 can prevent or mitigate local dimming, thereby permitting the lighting device 100 to continue producing an even, uninterrupted lighting experience for observers. In accordance with various embodiments, LEDs 106 can be configured to emit light in at least one of a single, homogenous white, a single, homogenous non-white color, a combination of non-white colors, or a combination of white with one or more non-white colors.

Figure 5A:
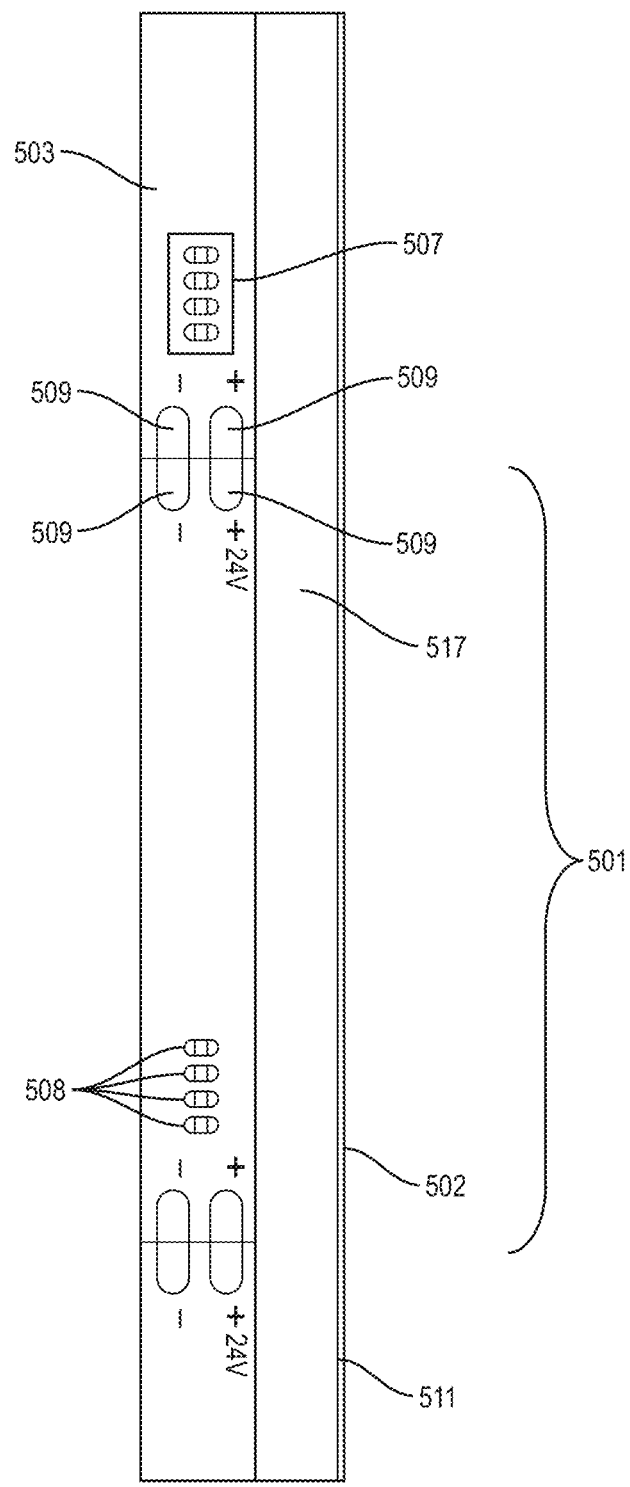
FIG. 5A is a top plan view of a side-emitting COB LED lighting device in accordance with various embodiments.
Figure 5B:
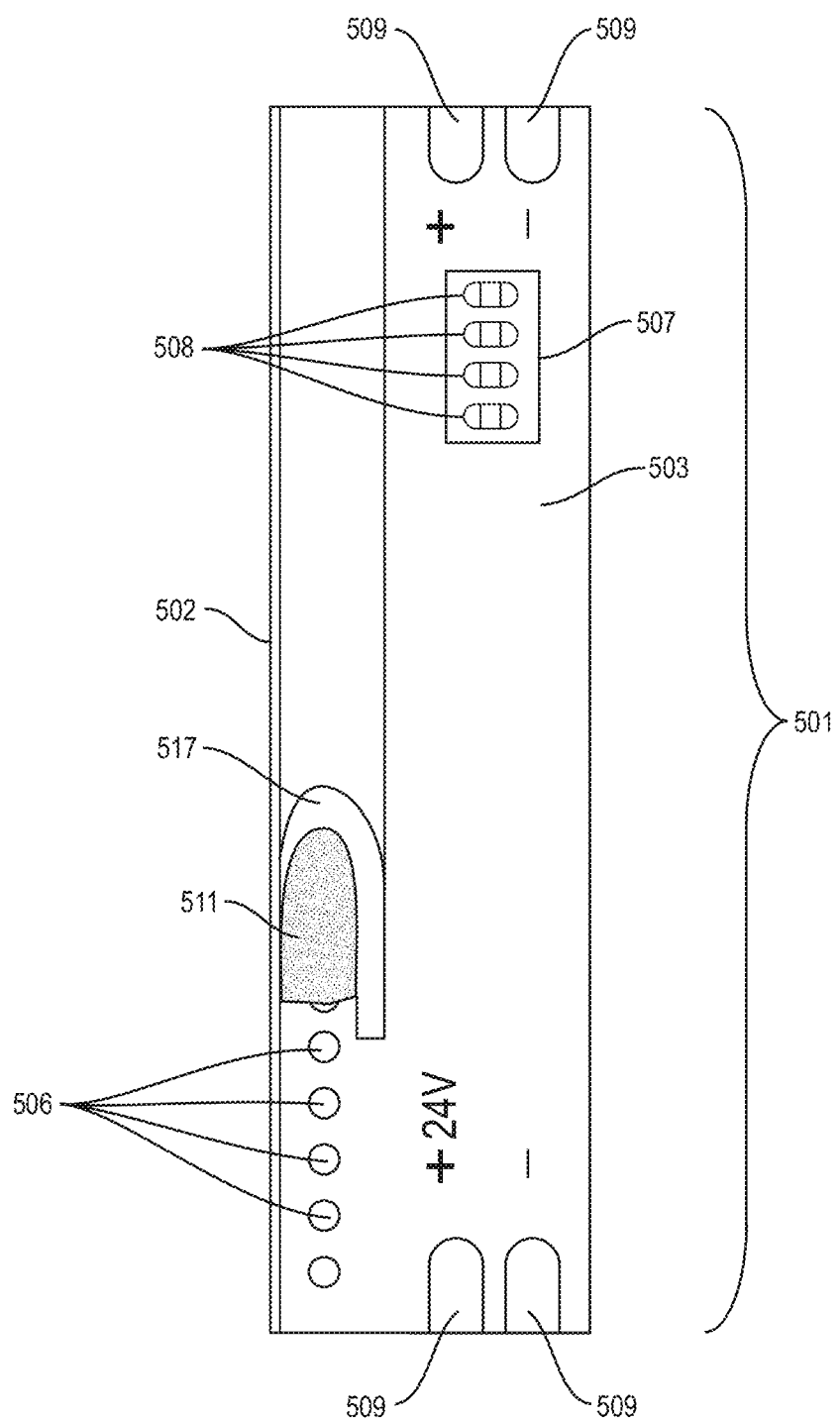
FIG. 5B is a top plan view of the side-emitting COB LED lighting device of FIG. 5A shown with a phosphor lightguide removed for clarity.
Figure 5C:
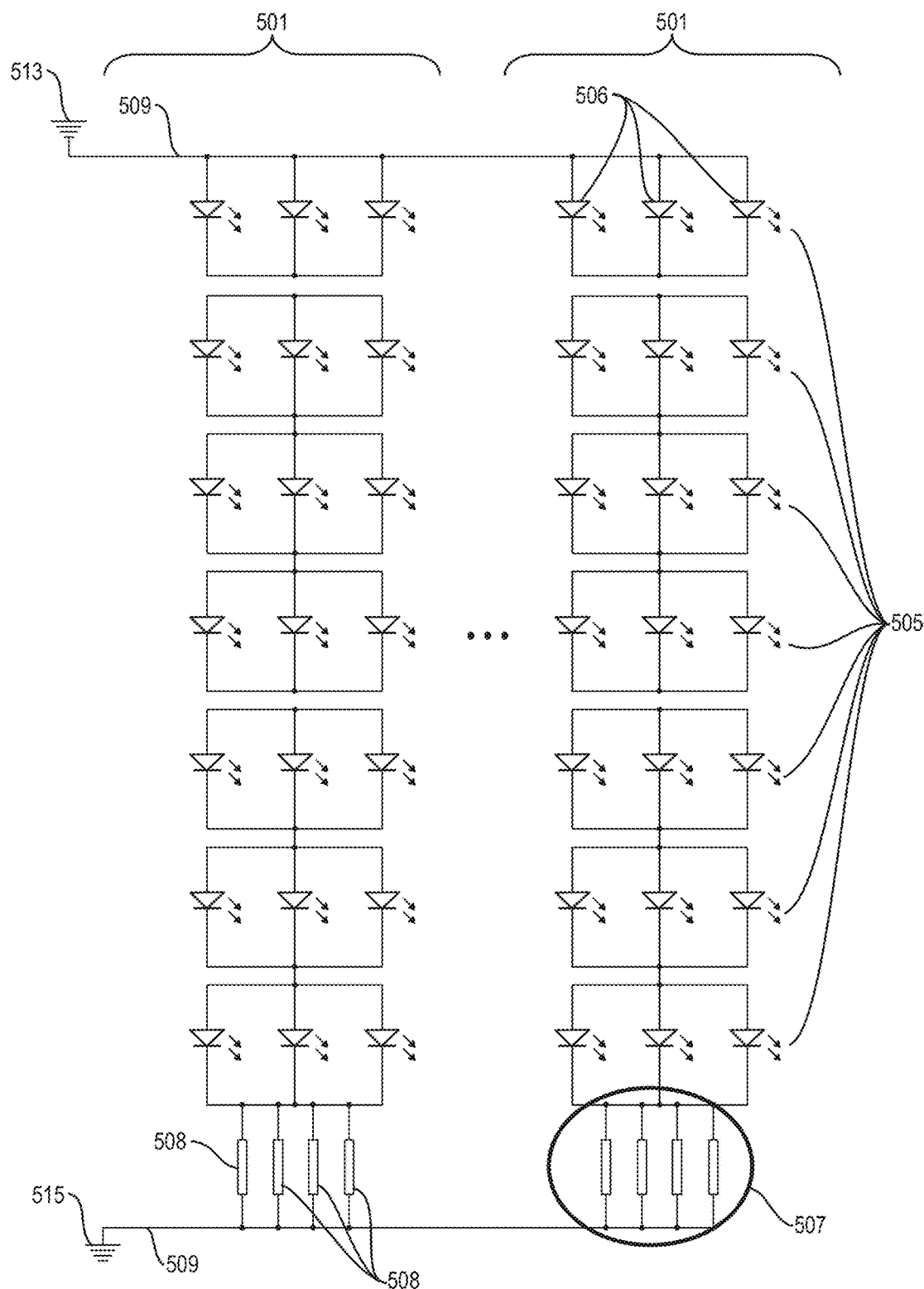
FIG. 5C is a circuit diagram illustrating the schematic layout of a plurality of parallel-connected LED segments of the side-emitting COB LED lighting device shown in FIGS. 5A and 5B.

The LED groups 105 and their constituent LEDs 106 can generally be formed on the substrate 103 in any suitable pattern. For example, as shown in FIG. 1B, the LED groups 105 and, consequently, the LEDs 106 of the segment 101 can be arranged to be distributed linearly along a longitudinal length of the segment 101 and substrate 103. As shown in FIG. 1B, in some embodiments, the LEDs 106 can be positioned along a central longitudinal axis of the substrate 103 and oriented perpendicular thereto for outward light emission. However, it will be apparent in view of this disclosure that any suitable positioning and orientation of the LEDs 106 can be used in accordance with various embodiments. For example, as shown in FIGS. 5A-C and described in greater detail below, in some embodiments, LEDs 506 can be positioned along a longitudinal edge of the substrate 503 and oriented parallel thereto for side light emission. In further example, in some embodiments the LEDs 106 and LED groups 105 can be formed on the substrate in a two dimensional pattern (e.g., a grid pattern such as in a light panel). In some embodiments a minimum density of LEDs 106 is preferred over a linear length or area of the lighting device to provide even, sufficiently bright lighting. For example, in some embodiments, e.g., where the lighting device 100 is a strip or tape light configured for conventional perpendicular light emission or side-emission, the lighting device 100 can have a density of at least 120 LEDs per meter. In some embodiments where uniformity of light emission is emphasized, a strip or tape light can include up to 528 LEDs per meter or more. In some embodiments, embodiments e.g., wherein the lighting device 100 is a light panel and the LEDs 106 and LED groups 105 are formed on the substrate in a two dimensional pattern, the lighting device 100 can have a density of at least 1200 LEDs per square meter.

In some embodiments a phosphor binder 111 can be disposed over the LED groups 105 to provide more even, uniform emittance at a desired color temperature. In this manner, the phosphor binder 111 can prevent the uneven, harsh illumination associated with conventional LED tape or strip lights. For example, the phosphor binder 111 can be formed from any suitable material such as, for example but not limited to, Cerium(III)-doped yttrium aluminum garnet (CE:YAG), terbium-doped YAG, terbium-doped yttrium gallium garnet (YGG), gadolinium-doped YAG, gadolinium-doped YGG, SiAlONs, including Europium(II)-doped β-SiAlON and α-SiAlON, CaAlSiN$_3$-based (CASH) phosphor, aluminum-doped zinc sulfide, R9, nitrides, oxynitrides, aluminates including lutetium aluminum garnet, silicate phosphors including barium lithium silicate and strontium lithium silicate, and combinations thereof.

Figure 2:
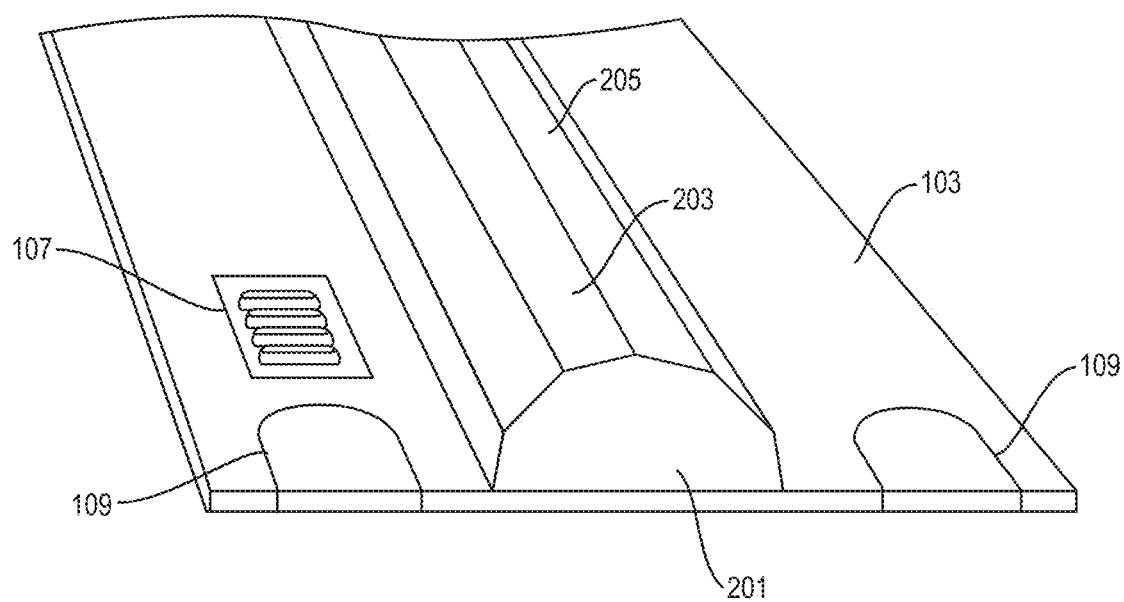
FIG. 2 is a cross-sectional perspective view of the phosphor lightguide of the COB LED lighting device shown in FIG. 1A.

The phosphor binder 111 can be applied and shaped in any suitable manner. For example, in some embodiments the phosphor binder 111 can be deposited over the LEDs 106 of the LED groups 105 of one or more segments 101 and then thermally or chemically cured. Such deposition of the phosphor binder 111 can be performed in a single step or, in some embodiments, can be performed via multiple deposition and/or curing steps. Referring now to FIG. 2, in some embodiments, the phosphor binder 111 can be provided with a cross-sectional shape to produce a desired beam angle and/or orientation of the light emitted by the phosphor-covered LED groups 105. For example, in some embodiments, the phosphor binder 111, once cured, can include a cross-section shaped to have a semi-circular, semi-elliptical, semi-hexagonal, semi-octagonal, semi-decagonal, semi-dodecagonal, square, rectangular, trapezoidal, irregular shapes, or any other combination of straight and curved elements. In some embodiments, the phosphor binder 111 can be shaped to produce any beam angle between about 180° and about 20°, including between about 160° and about 40°, between about 140° and about 60°, or about 120°. As shown in FIG. 2, the phosphor binder 111 can include a generally semicircular cross-section 201 modified to include opposing flat ridges 203, 205 on either side thereof. In some embodiments, formation of the flat ridges can produce an emission beam angle of 120°. Although shown in FIG. 2 as having equal width, chamfer or bevel angle, and height relative to the substrate 103, it will be apparent in view of this disclosure that opposing flat ridges 203, 205 may have differing dimensions and can be of varying width, angle, and height relative to the substrate 103 and one another as desired to control beam angle and orientation in accordance with various embodiments.

Figure 3A:
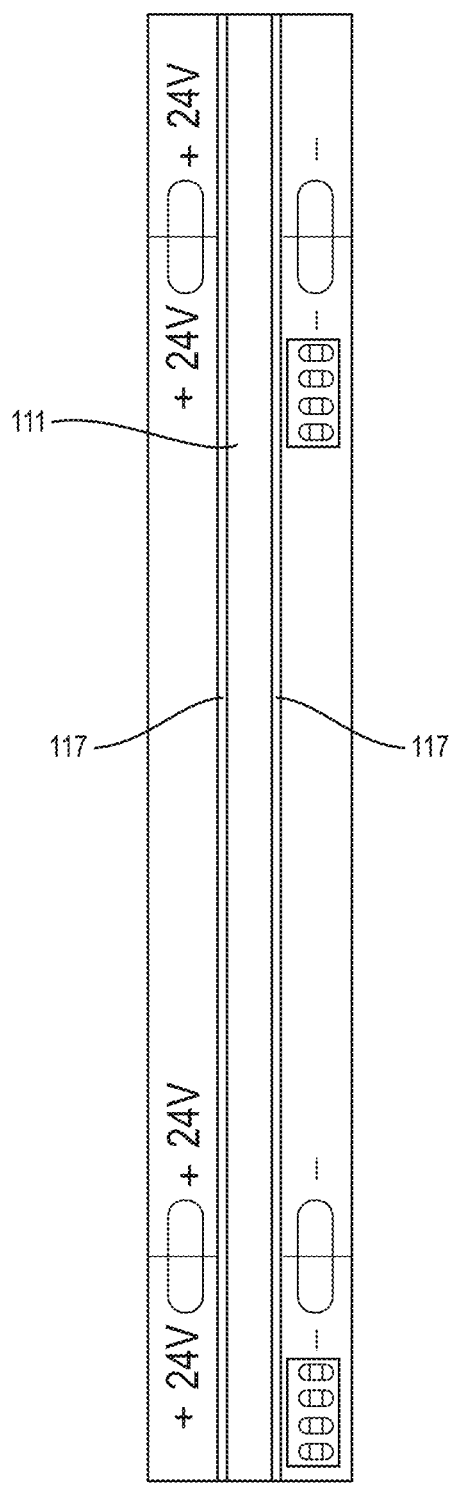
FIG. 3A is a top plan view of a COB LED lighting device having bounding walls in accordance with various embodiments.
Figure 3B:
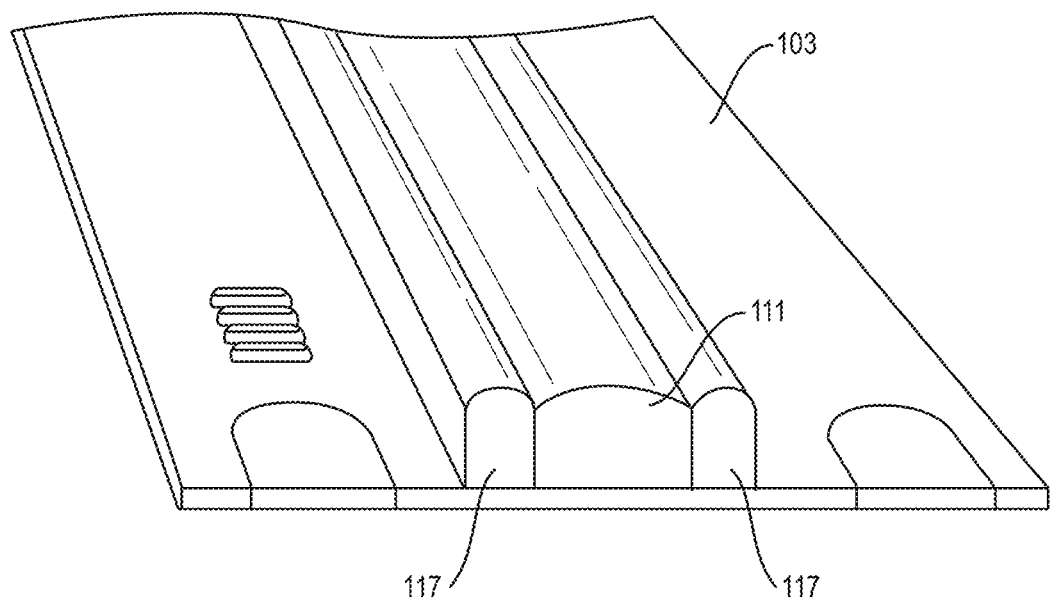
FIG. 3B is a cross-sectional perspective view of the phosphor lightguide of the COB LED lighting device having bounding walls shown in FIG. 3A.

Referring now to FIGS. 3A and 3B, in some embodiments, beam angle control can be further provided by one or more bounding walls 117. The bounding walls 117 can generally be any substantially opaque and/or reflective covering extending over a portion of the phosphor 111. For example, as shown in FIGS. 3A and 3B, the bounding walls 117 extend along a side of the phosphor 111 to limit light energy directed laterally, which is unlikely to be observable, instead directing light energy emitted by the LEDs 106 to be emitted through the phosphor 111 toward the area to be illuminated. However, it will be apparent in view of this disclosure that any configuration of one or more bounding walls 117 can be used in accordance with various embodiments (e.g., the bounding walls 517 for side-emitting embodiments as shown in FIGS. 5A-5C). In some embodiments, the bounding walls 117 can be externally applied to the phosphor 111 or deposited or formed on the phosphor 111. For example, bounding walls 117 can include reflective or opaque foils, papers, sheet metal, plastics, or polymer films applied over a portion of the phosphor 111 such as silicone, epoxy, PVC, polyurethane, aluminum foil, reflective tape, opaque tape, mirrored stainless steel, Kevlar, combinations thereof, or any other suitable material having a higher refractive index than the phosphor 111.

Each segment 101 can also include a current limiting resistor group 107 having a plurality of resistors 108 connected in parallel. This arrangement can advantageously provide redundancy such that, if one or more resistors fail (e.g., due to overload or age/wear) the remaining parallel-connected resistors 108 (or even just one remaining resistor 108) can provide the requisite resistance for the LED segment 101 to continue functioning. As shown, the resistor group 107 can be connected in series with the LED groups 105 to prevent burnout of the LEDs 106 in the LED groups 105. Although shown and described herein as including four resistors 108 per resistor group 107, it will be apparent in view of this disclosure that each resistor group 107 can, in some embodiments, include a single resistor or any number of additional resistors 108.

As explained above, conventional LED strip lights (also referred to as "LED tape") are configured such that the LEDs and at least one current-limiting resistor are mounted in close proximity to one another in some linear order along the strip (e.g., a segment could have three LEDs and one resistor and be mounted in an LED, LED, resistor, LED pattern). Distributing a phosphor binder smoothly over the LEDs of such prior art configurations is not advised. In particular, encapsulating the LEDs of such a prior art lighting device with phosphor binder would also encapsulate the current limiting resistors, which are in line with and proximate to the LEDs. In such a configuration, the heat radiated by the resistors would therefore be trapped by the phosphor binder and, consequently, significantly increase the operating temperature of the encapsulated LEDs. As would be known by one of skill in the art, increased operating temperature is correlated with both reduced LED light output and reduced LED lifespan. Therefore, encapsulating the LEDs of a prior art LED system results in reduced light output and lifespan of the lighting device. Furthermore, the presence of the resistors in line with the LEDs also creates "dead spots" where no light is emitted, which causes uneven observable light emissions.

The lighting devices 100 disclosed herein obviate such considerations by providing a resistor group 107 positioned external to the phosphor binder 111 in each segment 101. For example, as best shown in FIG. 1A, the resistor group 107 can be positioned on the substrate 103, laterally offset from the LEDs 106, and external to the phosphor binder 111. Due to this offset external positioning, the resistors 108 of the resistor group 107 remain exposed to ambient airflows during operation of the lighting device 100 and thus achieve proper cooling. Additionally, because the resistors 108 are positioned relatively further spaced apart from the LEDs, the heat emitted by the resistors 108 does not affect the operating temperature of the LEDs 106 covered by the binder 111. This configuration advantageously provides improved thermal management of the lighting device 100, increases LED 106 lifespan, and increases LED 106 emittance. Furthermore, because the resistors 108 are not interposed between the LEDs 106 on the substrate 103, the lighting device 100 avoids built-in "dead spots" having no emittance and can thus provide a more even, consistent observable light emittance.

The lighting device 101 can generally be comprised of multiple LED segments 101 connected to one another in parallel via contacts 109, wherein the first and/or last contacts 109 can be connected to a power supply 113 and/or a ground 115. The power supply 113, as used herein can include power received directly from a power source such as, for example, AC mains, a DC supply, or a battery or can also include power received from a so-called "power adapter" or "driver" configured to alter at least one electrical property of the direct power source such as, for example, frequency, current, voltage, or waveform. For example, in come embodiments an adapter or driver of the power supply 113 can convert an AC mains power signal from AC to DC (typically by reducing voltage, increasing frequency, and rectifying the waveform.

Referring now to FIGS. 5A-5C, in some embodiments a side-emitting lighting device 500 can be provided. The side-emitting lighting device can include a substrate 503 and LED segments 501 mounted or formed thereon along an edge 502 of the substrate 503. The LED segments 501 can each include a plurality of LED groups 505, a phosphor binder 511 distributed over the LED groups 505 and partially covered by a bounding wall 517, and a resistor group 507. The LED segments 501 can be connected to one another, a power source 513, and/or a ground 515 via electrical contacts 509.

In some embodiments, the substrate 503, resistor groups 507 and constituent resistors 508, contacts 509, phosphor binder 511, power supply 513, ground 515, and bounding walls 517 can be similar but not limited to, for example, the respective the substrate 103, resistor groups 107 and constituent resistors 108, contacts 109, phosphor binder 111, power supply 113, ground 115, and bounding walls 117 described above with reference to lighting device 100. Additionally, the electrical configuration of the side-emitting LED segments 501, LED groups 505, and LEDs 506 can, in accordance with various embodiments be electrically similar to the LED segments 101, LED groups 105, and LEDs 106 of lighting device 100.

However, the side-emitting lighting device 500 shown in FIGS. 5A-5C can be configured to emit light substantially parallel to the substrate 503 rather than substantially perpendicular as in the embodiment of FIGS. 1A-1C. In this regard, although not required, in some embodiments, the LEDs 506 and/or LED groups 505 can be positioned linearly along an edge 502 of the substrate 503, rather than being located along a central axis of the substrate 503 as in the embodiment described in FIGS. 1A-1C. As shown in FIGS. 5A and 5B, the boundary wall 517 can be configured to direct light emitted by the LEDs 506 through the phosphor 511 to be emitted from the lighting device 500 parallel to the substrate 503 (sideways). In general, the LEDs 506 can be configured and mounted to the substrate 503 as described above with reference to FIG. 4. However, it will be apparent in view of this disclosure that, in some embodiments, the LEDs 506 can be specifically designed for side emission and/or the substrate 503 itself may be configured to permit attachment of LEDs 506 in a generally perpendicular orientation to the substrate 503.

Figure 7A:
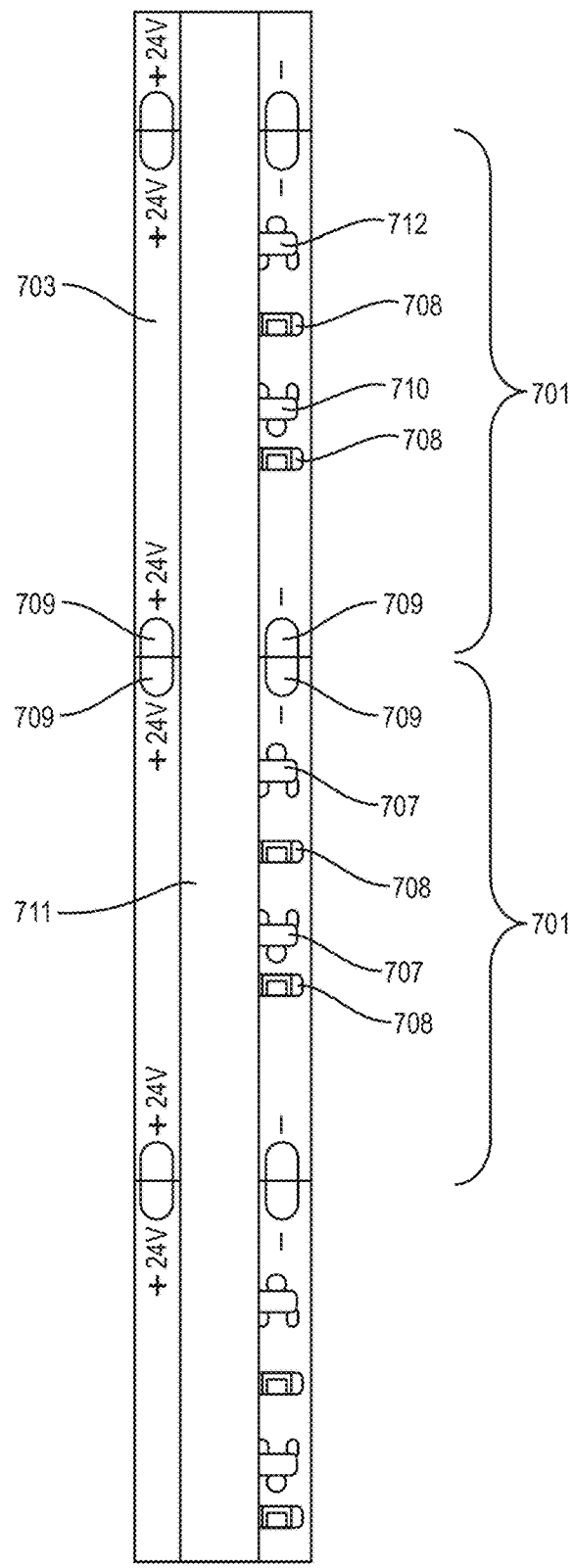
FIG. 7A is a top plan view of a current-controlled COB LED lighting device in accordance with various embodiments.
Figure 7B:
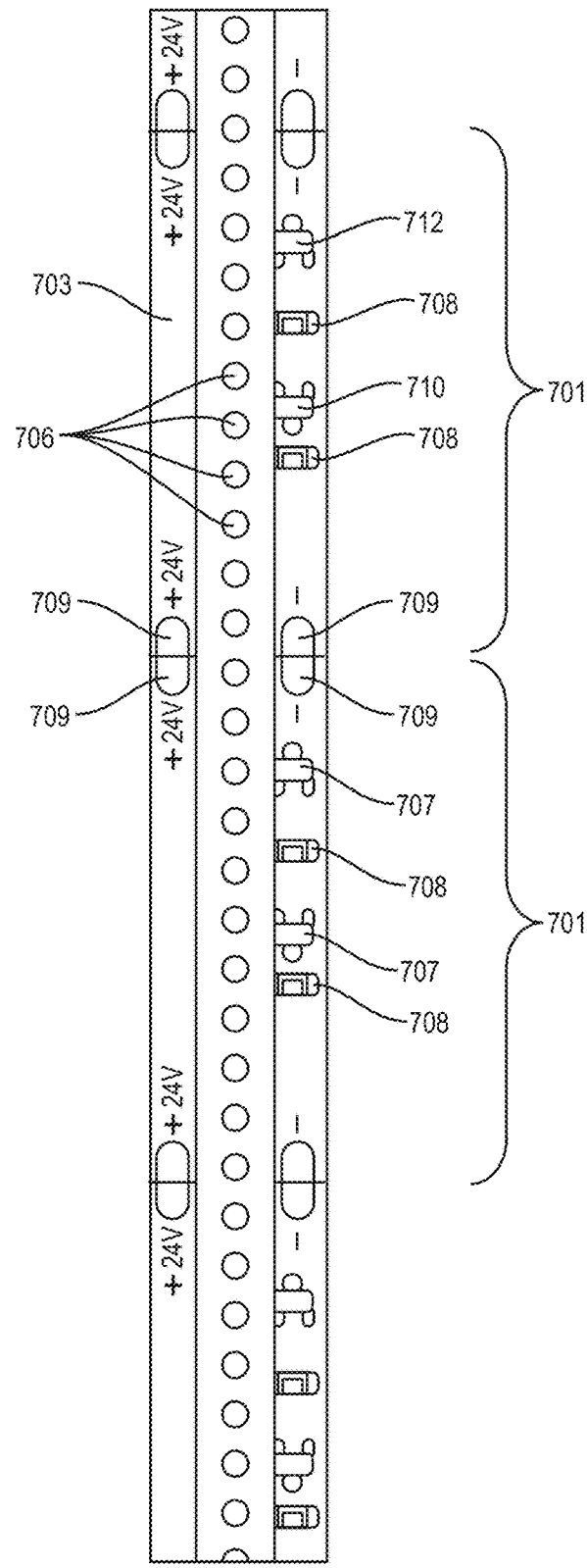
FIG. 7B is a top plan view of the current-controlled COB LED lighting device of FIG. 5A shown with a phosphor lightguide removed for clarity.
Figure 7C:
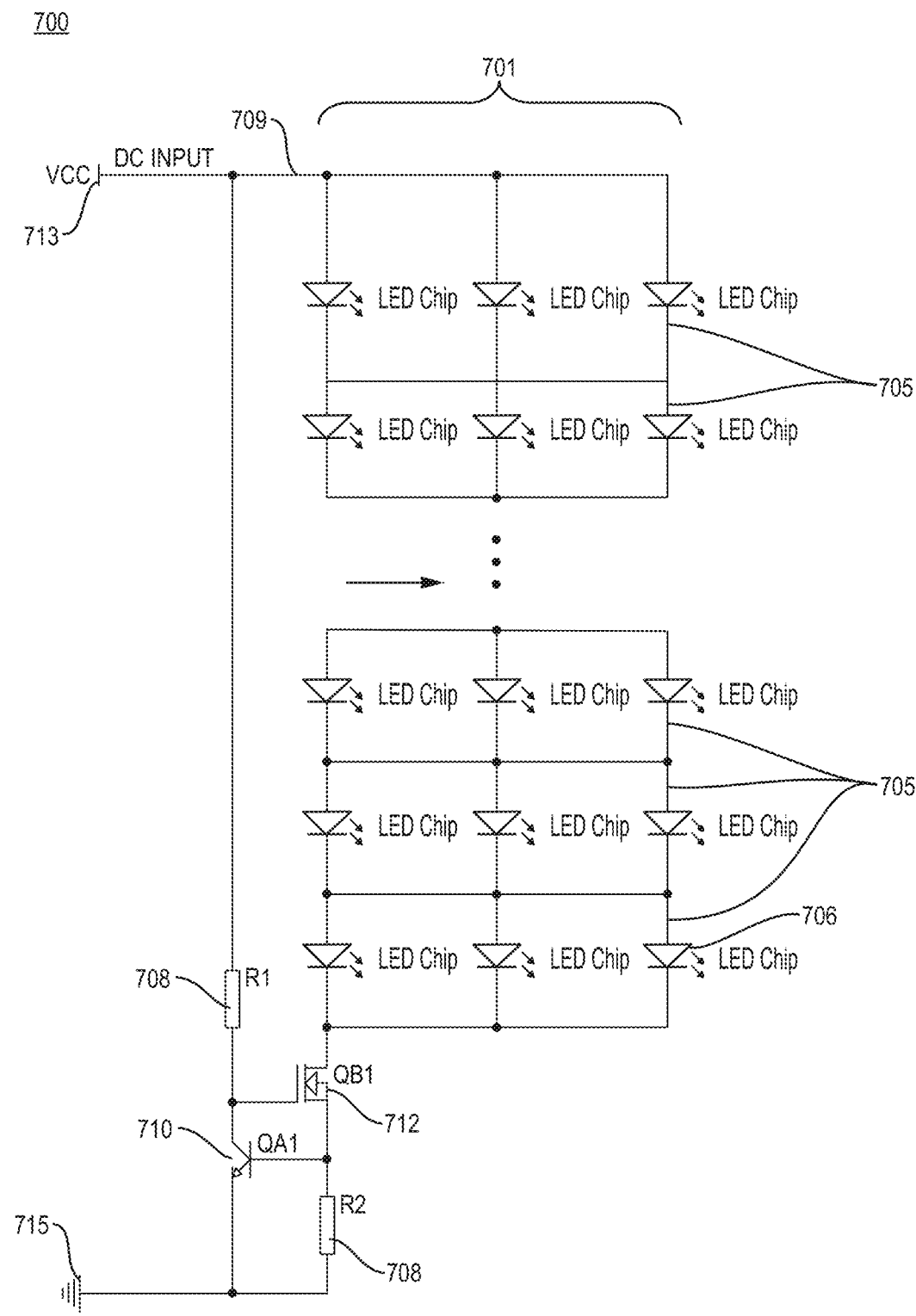
FIG. 7C is a circuit diagram illustrating the schematic layout of a plurality of parallel-connected LED segments of the current-controlled COB LED lighting device shown in FIGS. 7A and 7B.

Referring now to FIGS. 7A-7C, in some embodiments a current-controlled lighting device 700 can be provided. The current-controlled lighting device can include a substrate 703 and LED segments 701 mounted or formed thereon. The LED segments 701 can each include a plurality of LED groups 705, a phosphor binder 711 distributed over the LED groups 705, and current control circuitry. The LED segments 701 can be connected to one another, a power source 713, and/or a ground 715 via electrical contacts 709.

In some embodiments, the substrate 703, LED groups 705 and constituent LEDs 706, contacts 709, phosphor binder 711, power supply 713, and ground 715 can be similar but not limited to, for example, the respective the substrate 103, LED groups 105 and constituent LEDs 106, contacts 109, phosphor binder 111, power supply 113, ground 115, and bounding walls 117 described above with reference to lighting device 100. Additionally, the electrical configuration of the current-controlled LED groups 705, and LEDs 706 can, in accordance with various embodiments be electrically similar to the LED groups 105 and LEDs 106 of lighting device 100.

In some embodiments, where a constant current is desired, the resistor groups 107 can be replaced with a constant current control circuitry. For example, in the current-controlled lighting device 700 shown in FIGS. 7A-7C, the resistor groups 107 and resistors 108 of lighting device 100 can be replaced in each segment 701 with current control circuitry forming a current control sink 707 in order to provide more consistent, stable power and voltage to the LEDs 706 over long chains including multiple segments 701. As shown in FIG. 7C, for example, such current control sinks 707 can include a MOSFET 710 and a triode 712, each paired with a resistor 708 such that the two resistors 708, MOSFET 710, and triode 712 produce a constant current at QB1.

Figure 8A:
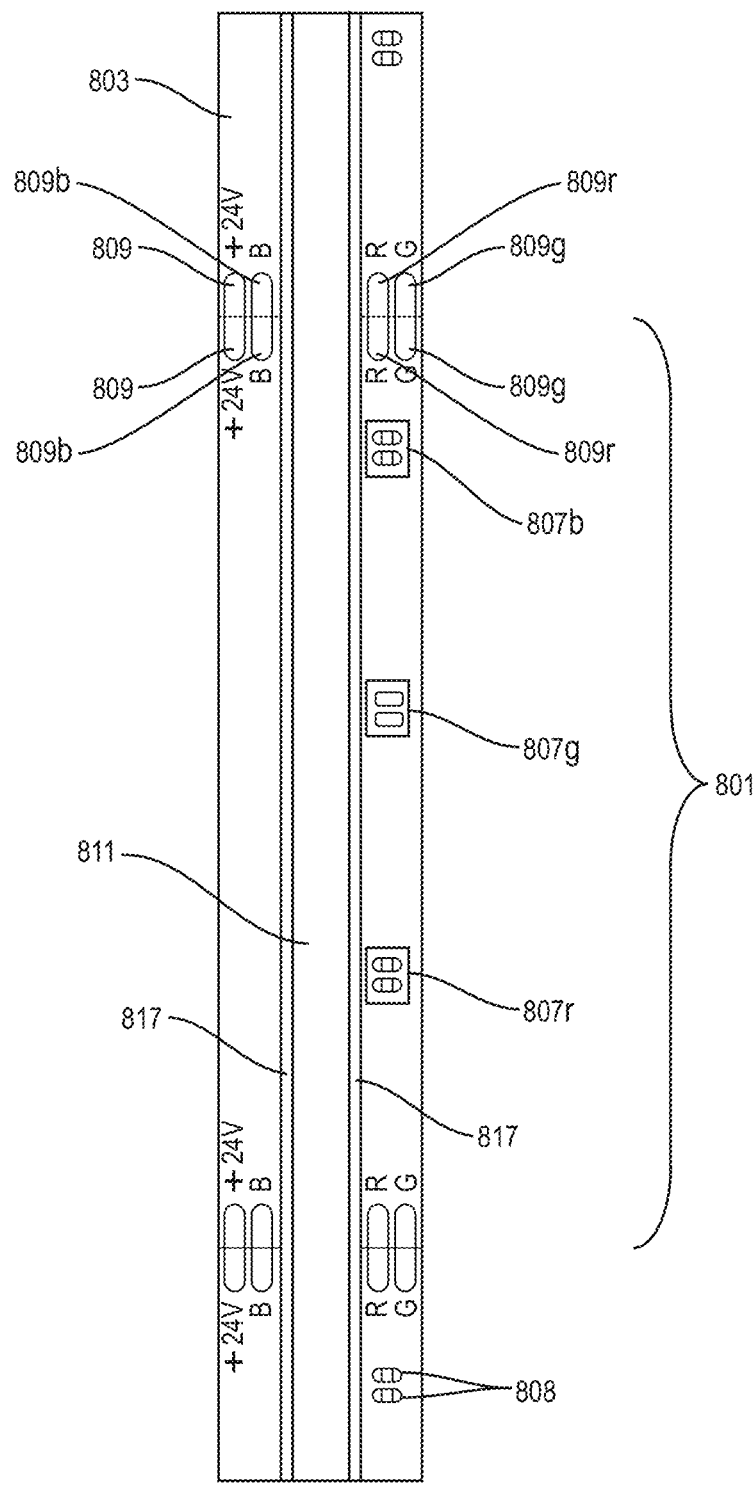
FIG. 8A is a top plan view of a multi-color COB LED lighting device in accordance with various embodiments.
Figure 8B:
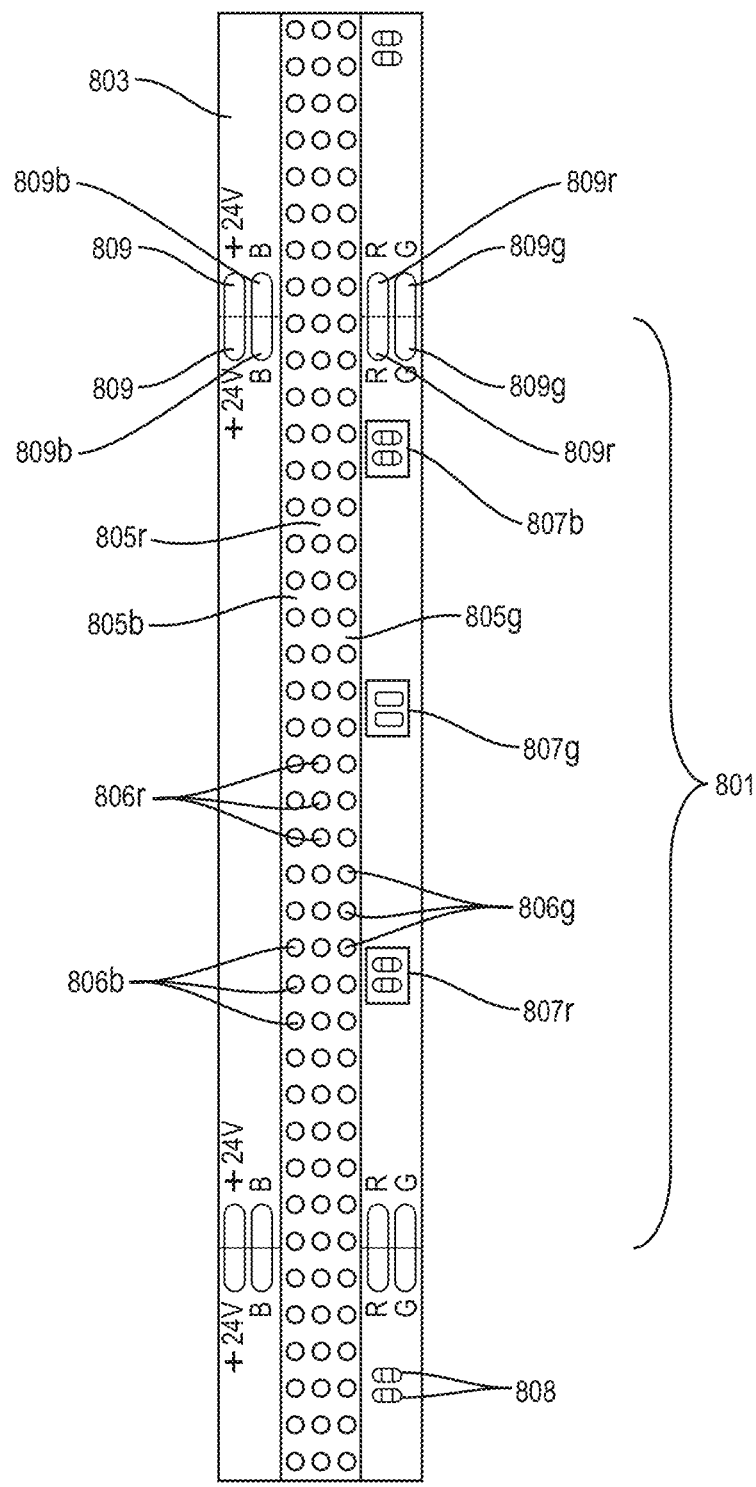
FIG. 8B is a top plan view of the multi-color COB LED lighting device of FIG. 5A shown with a phosphor lightguide removed for clarity.
Figure 8C:
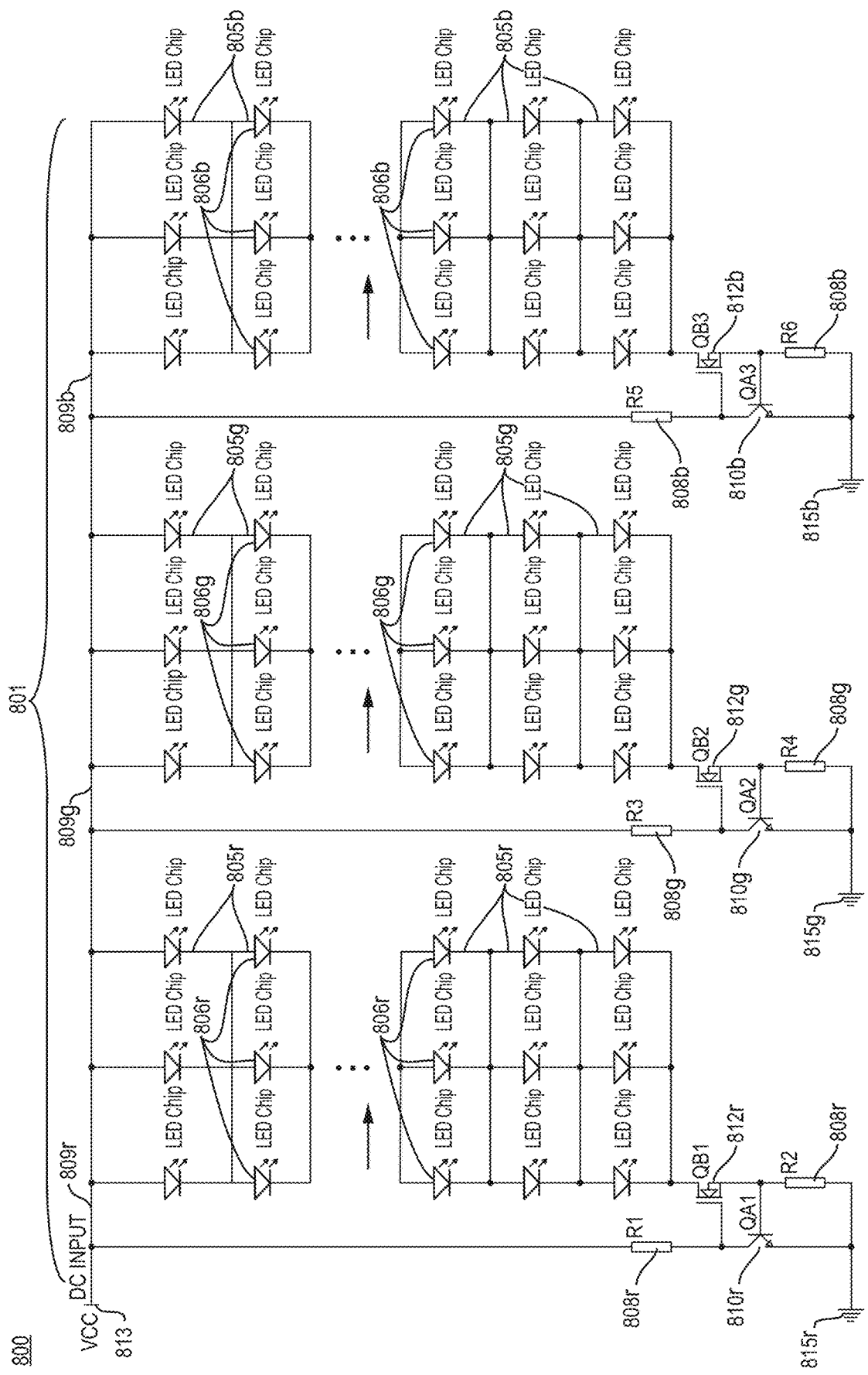
FIG. 8C is a circuit diagram illustrating the schematic layout of a plurality of parallel-connected LED segments of a current-controlled multi-color COB LED lighting device in accordance with various embodiments.

Referring now to FIGS. 8A-8C, in some embodiments a multi-color lighting device 800 can be provided. The multi-color lighting device 800 can include a substrate 803 and LED segments 801 mounted or formed thereon. The LED segments 801 can each include a plurality of red LED groups 805r each having at least one constituent red LED 806r, a plurality of green LED groups 805g each having at least one constituent green LED 806g, a plurality of blue LED groups 805b each having at least one constituent blue LED 806b, a phosphor binder 811 distributed over the LED groups 805r, 805g, 805b and optionally including a bounding wall 817, and multiple resistor groups 807r, 807g, 807b each having constituent resistors 808. The LED segments 801 can be connected to one another, a power source 813, and/or a ground 815 via electrical contacts 809, 809r, 809g, and 809b.

In some embodiments, the substrate 803, phosphor binder 811, power supply 813, ground 815, and bounding walls 817 can be similar but not limited to, for example, the respective substrate 103, phosphor binder 111, power supply 113, ground 115, and bounding walls 117 described above with reference to lighting device 100. Additionally, the general electrical configuration of the multi-color LED segments 801 including the LED groups 805r, 805g, 805b, and constituent LEDs 806r, 806g, 806b can each, in accordance with various embodiments be electrically similar to the LED segments 101, LED groups 105, and LEDs 106 of lighting device 100.

However, as shown in FIGS. 8A-8C, in the multi-color lighting device 800, the LED segments 801 include three parallel sets of LED groups—one for red LED groups 805r having red LEDs 806r, one for green LED groups 805g having green LEDs 806g, and one for blue LED groups 805b having blue LEDs 806b. Separate contacts 809r, 809g, and 809b can be used to provide power to each of the sets of LED groups 805r, 805g, 805g and separate current-limiting resistor groups 807r, 807g, 807b can be connected to each of the sets of LED groups 805r, 805g, 805g.

In some embodiments, where a constant current is desired, the resistor groups 807r, 807g, 807b can be replaced with a constant current control circuitry. For example, in the multi-colored lighting device 800 shown in FIGS. 8A-8B, the resistor groups 807r, 807g, 807b and resistors 808 of lighting device 800 can be replaced in each color set in segment 801 with current control circuitry forming a current control sink in order to provide more consistent, stable power and voltage to the LEDs 806r, 806g, 806b over long chains including multiple segments 801. As shown in FIG. 8C, for example, such current control sinks can include a MOSFET 810r, 810g, 810b and a triode 812r, 812g, 812b, each paired with a resistor 808 such that the two resistors 808, MOSFET 810r, 810g, 810b, and triode 812r, 812g, 812b produce a constant current at QB1, QB2, and QB3 respectively.

Figure 9A:
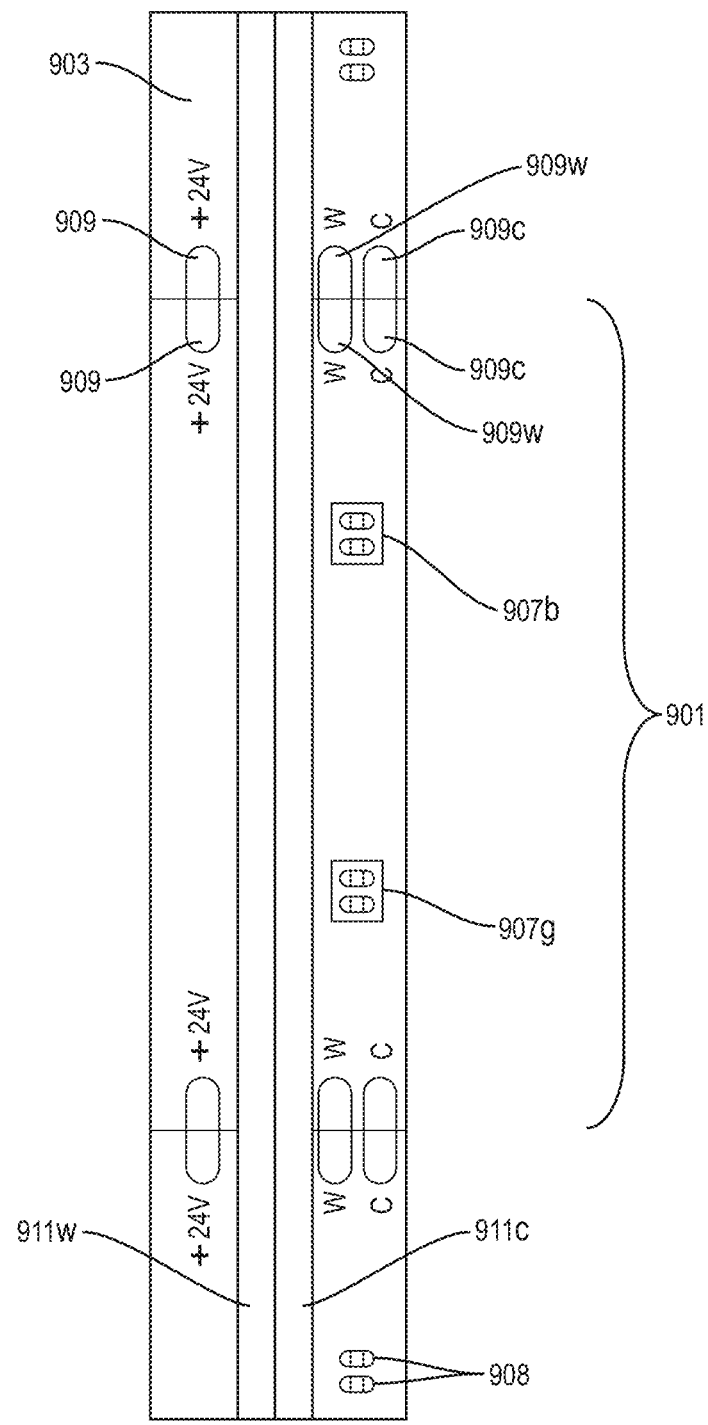
FIG. 9A is a top plan view of a tunable white COB LED lighting device in accordance with various embodiments.
Figure 9B:
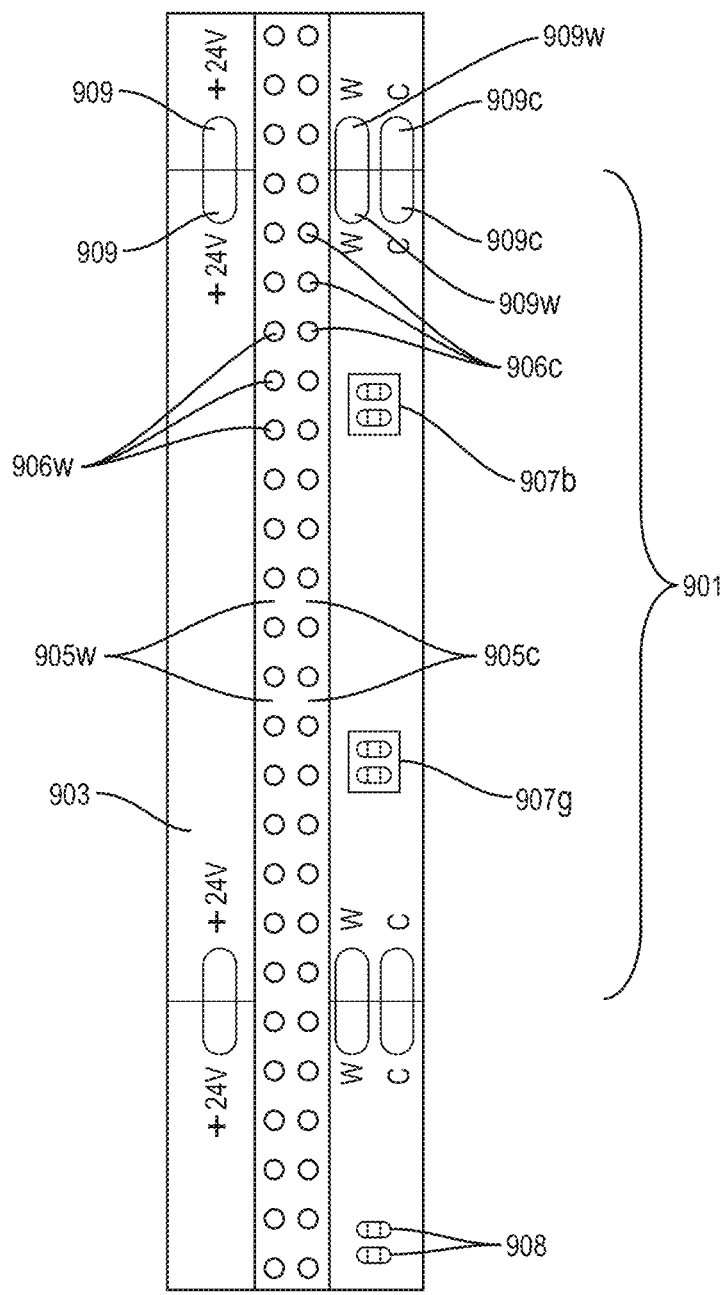
FIG. 9B is a top plan view of the tunable white COB LED lighting device of FIG. 5A shown with a phosphor lightguide removed for clarity.

Referring now to FIGS. 9A-9B, in some embodiments a tunable white lighting device 900 can be provided. The tunable white lighting device 900 can include a substrate 903 and LED segments 901 mounted or formed thereon. The LED segments 901 can each include a plurality of warm LED groups 905w each having at least one constituent warm LED 906w, a plurality of cool LED groups 905c each having at least one constituent cool LED 906c, a phosphor binder 911 distributed over the LED groups 905w, 905c and optionally including a bounding wall 917, and multiple resistor groups 907r, 907g, 907b each having constituent resistors 908. The LED segments 901 can be connected to one another, a power source 913, and/or a ground 915 via electrical contacts 909, 909w, 909c.

In some embodiments, the substrate 903, phosphor binder 911w, 911c, power supply 913, ground 915, and bounding walls 917 can be similar but not limited to, for example, the respective substrate 103, phosphor binder 111, power supply 113, ground 115, and bounding walls 117 described above with reference to lighting device 100. Additionally, the general electrical configuration of the multi-color LED segments 901 including the LED groups 905r, 905g, 905b, and constituent LEDs 906r, 906g, 906b can each, in accordance with various embodiments be electrically similar to the LED segments 101, LED groups 105, and LEDs 106 of lighting device 100.

However, as shown in FIGS. 9A-9B, in the tunable white lighting device 900, the LED segments 901 include two parallel sets of LED groups—one for warm LED groups 905w having warm LEDs 906w and one for cool LED groups 905c having cool LEDs 906c. Separate contacts 909w, 909c can be used to provide power to each of the sets of LED groups 905w, 905c, and separate current-limiting resistor groups 907w, 907c can be connected to each of the sets of LED groups 905w, 905c.

In some embodiments, different LED chips can be used for the warm LEDs 906w and the cool LEDs 906c. In some embodiments, a same type of LED chip can be used for both the warm LEDs 906w and the cool LEDs 906c. In either embodiment, the color temperature (i.e. warm or cool) can be further impacted by the use of different phosphor binders for the warm and cool LED sets. For example, as shown in FIG. 9A, the warm phosphor binder 911w can be deposited over the warm LED groups 905w having the warm LEDs 906w and the cool phosphor binder 911c can be deposited over the cool LED groups 905c having the cool LEDs 906c in order to produce the desired color temperature responsive to activation or deactivation of the warm LEDs 906w or the cool LEDs 906c.

Figure 9C:
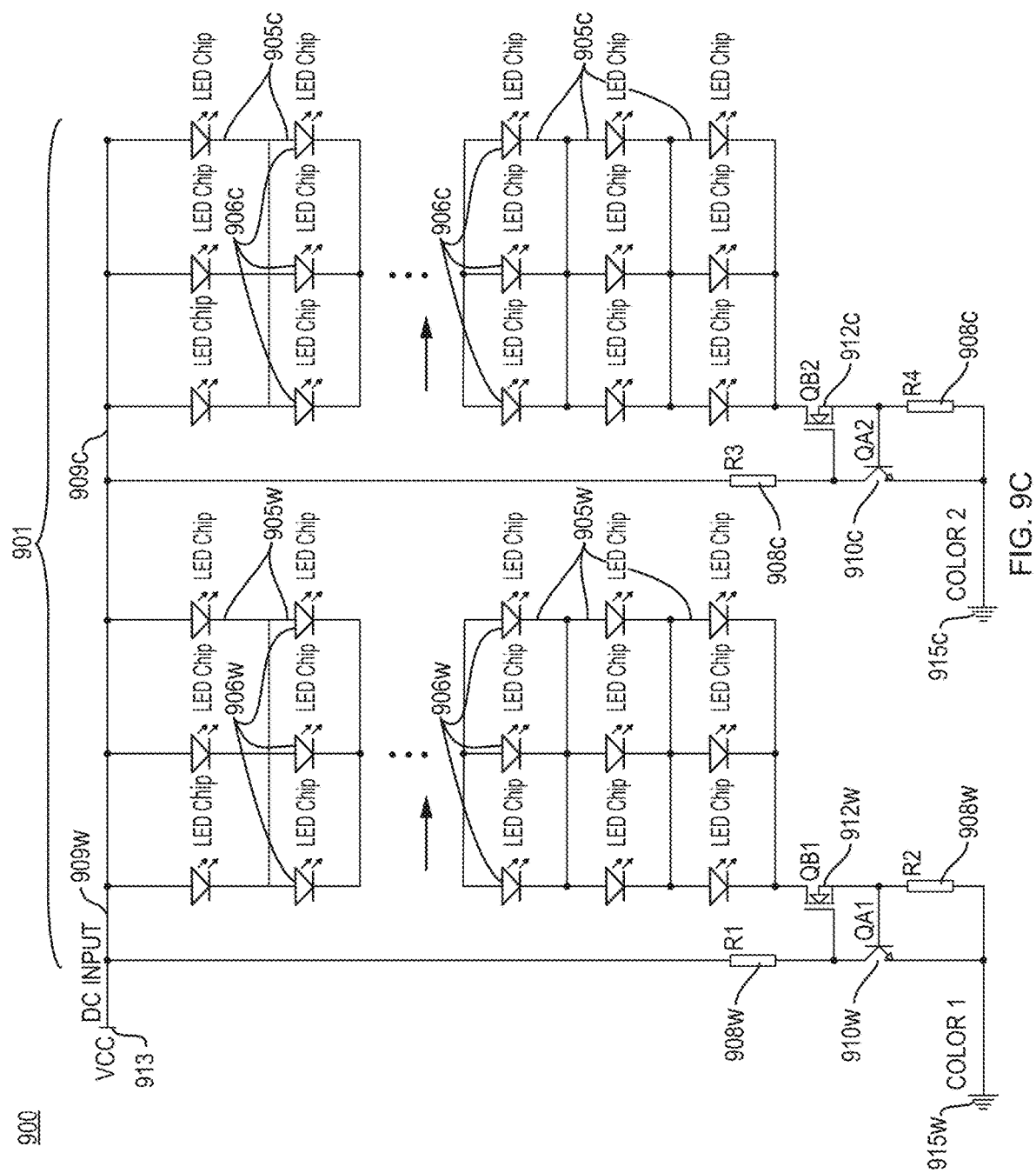
FIG. 9C is a circuit diagram illustrating the schematic layout of a plurality of parallel-connected LED segments of a current-controlled tunable white COB LED lighting device in accordance with various embodiments.

In some embodiments, where a constant current is desired, the resistor groups 907r, 907g, 907b can be replaced with a constant current control circuitry. For example, in the tunable white lighting device 900 shown in FIGS. 9A-9B, the resistor groups 907w, 907c and resistors 908 of lighting device 900 can be replaced in each color set in segment 901 with current control circuitry forming a current control sink in order to provide more consistent, stable power and voltage to the LEDs 906w, 906c over long chains including multiple segments 901. As shown in FIG. 9C, for example, such current control sinks can include a MOSFET 910w, 910c and a triode 912w, 912c, each paired with a resistor 908 such that the two resistors 908, MOSFET 910w, 910c, and triode 912w, 912c produce a constant current at QB1 and QB2 respectively.

While the foregoing description of the invention enables one of ordinary skill to make and use what is considered presently to be the best mode thereof, those of ordinary skill will understand and appreciate the existence of variations, combinations, and equivalents of the specific embodiments and examples herein. The above-described embodiments of the present invention are intended to be examples only. Alterations, modifications and variations may be effected to the particular embodiments by those of skill in the art without departing from the scope of the invention, which is defined solely by the claims appended hereto. The invention is therefore not limited by the above described embodiments and examples.

Having described the invention, and a preferred embodiment thereof, what is claimed as new and secured by Letters Patent is:

1. A chip-on-board (COB) LED lighting device comprising:
   a substrate;
   at least one parallel-connected LED segment formed on the substrate, each LED segment including at least one series-connected LED groups mounted to the substrate, each of the LED groups including at least one parallel-connected LEDs, each LED connected to a pad of the substrate;
   a phosphor binder distributed over the LED segments on the substrate;
   a bounding wall extending over at least a portion of a side of the phosphor binder, the bounding wall having a higher refractive index than the phosphor binder; and
   a current control circuit in electrical communication with each of the LED segments, each current control circuit formed on the substrate adjacent to the LED segments, external to the phosphor binder.

2. The COB LED lighting device of claim 1, wherein the substrate is a printed circuit board (PCB).

3. The COB LED lighting device of claim 2, wherein the PCB includes an integrated buffer configured to provide shock absorbing properties to the PCB proximate the LEDs.

4. The COB LED lighting device of claim 1, wherein each LED group includes at least two parallel-connected LEDs.

5. The COB LED lighting device of claim 1, wherein each LED segment includes at least two series-connected LED groups.

6. The COB LED lighting device of claim 1, wherein the current control circuit includes a current limiting resistor group in electrical communication with each of the LED segments, each current limiting resistor group including at least one current limiting parallel-connected resistor.

7. The COB LED lighting device of claim 1, wherein the current control circuit includes at least one of an integrated chip (IC) constant current circuit and a MOS transistor constant current circuit.

8. The COB LED lighting device of claim 1, wherein the COB LED lighting device is a strip light.

9. The COB LED lighting device of claim 8, wherein the LED segments are formed on the substrate at a density of at least 120 LEDs per meter.

10. The COB LED lighting device of claim 1, wherein the COB LED lighting device is a light panel.

11. The COB LED lighting device of claim 10, wherein the LED segments are formed on the substrate at a density of at least 1200 LEDs per square meter.

12. The COB LED lighting device of claim 1, wherein a cross-section of the phosphor binder is shaped to produce a beam angle of 180° or less in an illuminated state of the LED segments.

13. The COB LED lighting device of claim 12, wherein the cross-section of the phosphor binder is shaped to produce the beam angle between 170° and 120° in an illuminated state of the LED segments.

14. The COB LED lighting device of claim 12, wherein the cross-section of the phosphor binder is at least one of semi-circular, semi-elliptical, semi-hexagonal, semi-octagonal, semi-decagonal, semi-dodecagonal, square, rectangular, trapezoidal, irregular shapes, or any other combination of straight and curved elements.

15. The COB LED lighting device of claim 12, wherein the phosphor binder includes a first side and a second side, the first side including a first ridge formed thereon and the second side including a second ridge formed thereon.

16. The COB LED lighting device of claim 15, wherein the first ridge and the second ridge are sized and positioned to achieve a desired beam angle.

17. The COB LED lighting device of claim 15, wherein a size and position of each of the first ridge and the second ridge, in combination with a size, a position, and the refractive index of the bounding layer are configured to achieve a desired beam angle.

18. The COB LED lighting device of claim 1, wherein the LEDs are oriented to emit light substantially perpendicular to the substrate.

19. The COB LED lighting device of claim 18, wherein the phosphor binder includes a first side, an opposing second side, and a light-emitting upper side opposite the substrate, wherein the bounding wall further comprises:
   a first bounding wall element extending over at least a portion of the first side of the phosphor binder; and
   a second bounding wall element extending over at least a portion of the second side of the phosphor binder.

20. The COB LED lighting device of claim 1, wherein the LEDs are oriented to emit light substantially parallel to the substrate.

21. The COB LED lighting device of claim 20, wherein the phosphor binder includes a light-emitting side, an opposing side, and an upper side opposite the substrate, the bounding wall extending over at least a portion of the upper side.

22. The COB LED lighting device of claim 1, wherein each LED segment further comprises a pair of input electrical contacts formed on the substrate at an input end of the LED segment and pair of output electrical contacts formed on the substrate at an output end of the LED segment, each of the input and output electrical contacts formed on the substrate adjacent to the LED segments, external to the phosphor binder.

23. The COB LED lighting device of claim 20, wherein:
the input electrical contacts are electrically connectable to at least one of a DC power source or a pair of output contacts of a different LED segment; and
the output electrical contacts are electrically connectable to a pair of input contacts of a different LED segment or are positioned at a terminal end of the COB LED lighting device.

24. The COB LED lighting device of claim 1, wherein:
the substrate further comprises a first side and a second side, and
the LED segments, the phosphor binder, and the current control circuits are all formed on a same one of the first side of the substrate.

25. The COB LED lighting device of claim 24, further comprising an adhesive distributed over the second side of the substrate.

26. The COB LED lighting device of claim 1, wherein the LEDs are configured to emit light in at least one of a single, homogenous white, a single, homogenous non-white color, a combination of non-white colors, or a combination of white with one or more non-white colors.

27. The COB LED lighting device of claim 1, wherein a size, a position, and the refractive index of the bounding layer are configured to achieve a desired beam angle.

* * * * *